(12) United States Patent
Chen et al.

(10) Patent No.: US 9,871,123 B2
(45) Date of Patent: Jan. 16, 2018

(54) FIELD EFFECT TRANSISTOR AND MANUFACTURING METHOD THEREOF

(71) Applicant: UNITED MICROELECTRONICS CORP., Hsinchu (TW)

(72) Inventors: Tong-Yu Chen, Hsinchu (TW); Chih-Jung Wang, Hsinchu (TW)

(73) Assignee: UNITED MICROELECTRONICS CORP., Hsinchu (TW)

( * ) Notice: Subject to any disclaimer, the term of this patent is extended or adjusted under 35 U.S.C. 154(b) by 323 days.

(21) Appl. No.: 14/636,430

(22) Filed: Mar. 3, 2015

(65) Prior Publication Data

US 2015/0171194 A1 Jun. 18, 2015

Related U.S. Application Data

(62) Division of application No. 13/517,759, filed on Jun. 14, 2012, now Pat. No. 9,012,975.

(51) Int. Cl.
*H01L 21/28* (2006.01)
*H01L 29/66* (2006.01)
(Continued)

(52) U.S. Cl.
CPC .. *H01L 29/66833* (2013.01); *H01L 21/28282* (2013.01); *H01L 21/31111* (2013.01); *H01L 21/31144* (2013.01); *H01L 29/42344* (2013.01); *H01L 29/66795* (2013.01); *H01L 29/785* (2013.01); *H01L 29/792* (2013.01)

(58) Field of Classification Search
CPC ......... H01L 29/66833; H01L 29/42348; H01L 29/42344; H01L 21/31111; H01L 21/31144; H01L 29/66795; H01L 29/785; H01L 21/28282; H01L 29/7851; H01L 21/845; H01L 21/823821; H01L 27/1211; H01L 29/792; H01L 27/0924; H01L 29/41791

See application file for complete search history.

(56) References Cited

U.S. PATENT DOCUMENTS 6,043,138 A 3/2000 Ibok
6,492,216 B1 12/2002 Yeo et al.
(Continued)

FOREIGN PATENT DOCUMENTS

| TW | 200746420 | 12/2007 |
|----|-----------|---------|
| TW | 201209998 | 3/2012 |
| WO | 2007054844 | 5/2007 |

OTHER PUBLICATIONS

Taiwan intellectual Property Office, Office Action dated Nov. 18, 2015.

*Primary Examiner* — Bac Au
(74) *Attorney, Agent, or Firm* — WPAT, PC

(57) ABSTRACT

A field effect transistor (FET) and a manufacturing method thereof are provided. The FET includes a substrate, a fin bump, an insulating layer, a charge trapping structure and a gate structure. The fin bump is disposed on the substrate. The insulating layer is disposed on the substrate and located at two sides of the fin bump. The charge trapping structure is disposed on the insulating layer and located at least one side of the fin bump. A cross-section of the charge trapping structure is L-shaped. The gate structure covers the fin bump and the charge trapping structure.

10 Claims, 8 Drawing Sheets

(51) Int. Cl.
  *H01L 29/78*  (2006.01)
  *H01L 29/423* (2006.01)
  *H01L 29/792* (2006.01)
  *H01L 21/311* (2006.01)

(56) References Cited

U.S. PATENT DOCUMENTS

| | | | |
|---|---|---|---|
| 6,806,517 B2 | 10/2004 | Kim et al. | |
| 6,921,963 B2 | 7/2005 | Krivokapic et al. | |
| 7,087,477 B2 | 8/2006 | Fried et al. | |
| 7,091,551 B1 | 8/2006 | Anderson et al. | |
| 7,247,887 B2 | 7/2007 | King et al. | |
| 7,250,658 B2 | 7/2007 | Doris et al. | |
| 7,309,626 B2 | 12/2007 | Ieong et al. | |
| 7,329,580 B2 | 2/2008 | Choi et al. | |
| 7,352,034 B2 | 4/2008 | Booth, Jr. et al. | |
| 7,375,394 B2 | 5/2008 | Jeng | |
| 7,442,988 B2 * | 10/2008 | Oh | H01L 21/28282 257/314 |
| 7,470,570 B2 | 12/2008 | Beintner et al. | |
| 7,531,437 B2 | 5/2009 | Brask et al. | |
| 7,569,857 B2 | 8/2009 | Tolchinsky et al. | |
| 7,795,088 B2 * | 9/2010 | Hsu | H01L 21/28282 257/324 |
| 7,855,411 B2 * | 12/2010 | Hsu | H01L 21/28282 257/308 |
| 2004/0195624 A1 | 10/2004 | Liu et al. | |
| 2005/0051825 A1 | 3/2005 | Fujiwara et al. | |
| 2006/0099830 A1 | 5/2006 | Walther et al. | |
| 2006/0115978 A1 | 6/2006 | Specht et al. | |
| 2006/0286729 A1 | 12/2006 | Kavalieros et al. | |
| 2007/0054448 A1 * | 3/2007 | Choi | H01L 21/28273 438/201 |
| 2007/0108528 A1 | 5/2007 | Anderson et al. | |
| 2007/0134884 A1 | 6/2007 | Kim et al. | |
| 2007/0158756 A1 | 7/2007 | Dreeskornfeld et al. | |
| 2008/0116508 A1 | 5/2008 | Hayashi et al. | |
| 2008/0142878 A1 | 6/2008 | Choi et al. | |
| 2008/0157208 A1 | 7/2008 | Fischer et al. | |
| 2008/0230824 A1 | 9/2008 | Doornbos et al. | |
| 2009/0078997 A1 * | 3/2009 | Greene | H01L 21/823807 257/347 |
| 2009/0124097 A1 | 5/2009 | Cheng | |
| 2009/0242964 A1 | 10/2009 | Akil et al. | |
| 2009/0269916 A1 | 10/2009 | Kang et al. | |
| 2009/0303794 A1 * | 12/2009 | Wu | G11C 11/404 365/185.17 |
| 2010/0038700 A1 | 2/2010 | Okazaki et al. | |
| 2010/0048027 A1 | 2/2010 | Cheng et al. | |
| 2010/0072553 A1 | 3/2010 | Xu et al. | |
| 2010/0144121 A1 | 6/2010 | Chang et al. | |
| 2010/0167506 A1 | 7/2010 | Lin et al. | |

* cited by examiner

FIELD EFFECT TRANSISTOR AND MANUFACTURING METHOD THEREOF

This application is a divisional application of U.S. application Ser. No. 13/517,759, filed Jun. 14, 2012, the contents of which are incorporated herein by reference.

BACKGROUND

Technical Field

The disclosure relates in general to a transistor and a manufacturing method thereof, and more particularly to a field effect transistor and a manufacturing method thereof.

Description of the Related Art

With the development of semiconductor technology, varied semiconductor elements are invented. Those semiconductor elements are widely used in electric devices.

Field effect transistor (FET) is an important semiconductor element. In a FET, the shaped of a conductive channel is changed by controlling an electric field, so that the electric conductivity of the conductive channel can be adjusted.

SUMMARY

The disclosure is directed to a field effect transistor (FET) and a manufacturing method thereof. A gate structure, a charge trapping structure and a fin bump form a three-dimensional fin FET for reducing the volume thereof.

According to a first aspect of the present disclosure, a field effect transistor (FET) is provided. The FET includes a substrate, a fin bump, an insulating layer, a charge trapping structure and a gate structure. The fin bump is disposed on the substrate. The insulating layer is disposed on the substrate and located at two sides of the fin bump. The charge trapping structure is disposed on the insulating layer and located at at least one side of the fin bump. A cross-section of the charge trapping structure is a L-shaped. The gate structure covers the fin bump and the charge trapping structure.

According to a second aspect of the present disclosure, a manufacturing method of a field effect transistor is provided. The manufacturing method comprises the following steps. A substrate is provided. A fin bump is formed on the substrate. An insulating layer is formed on the substrate. The insulating layer is located at two sides of the fin bump. A charge trapping material is disposed on the fin bump and the substrate. Part of the charge trapping material covering the fin bump is etched to expose part of the fin bump. A gate structure is formed on the fin bump and part of the charge trapping material. The charge trapping material is etched by using the gate structure as a mask to form a L-shaped charge trapping structure.

The above and other aspects of the disclosure will become better understood with regard to the following detailed description of the non-limiting embodiments. The following description is made with reference to the accompanying drawings.

DETAILED DESCRIPTION

Several embodiments are disclosed below for elaborating the invention. The following embodiments are for the purpose of elaboration only, not for limiting the scope of protection of the invention. Besides, secondary elements are omitted in the following embodiments to highlight the technical features of the invention.

First Embodiment

Figure 1:
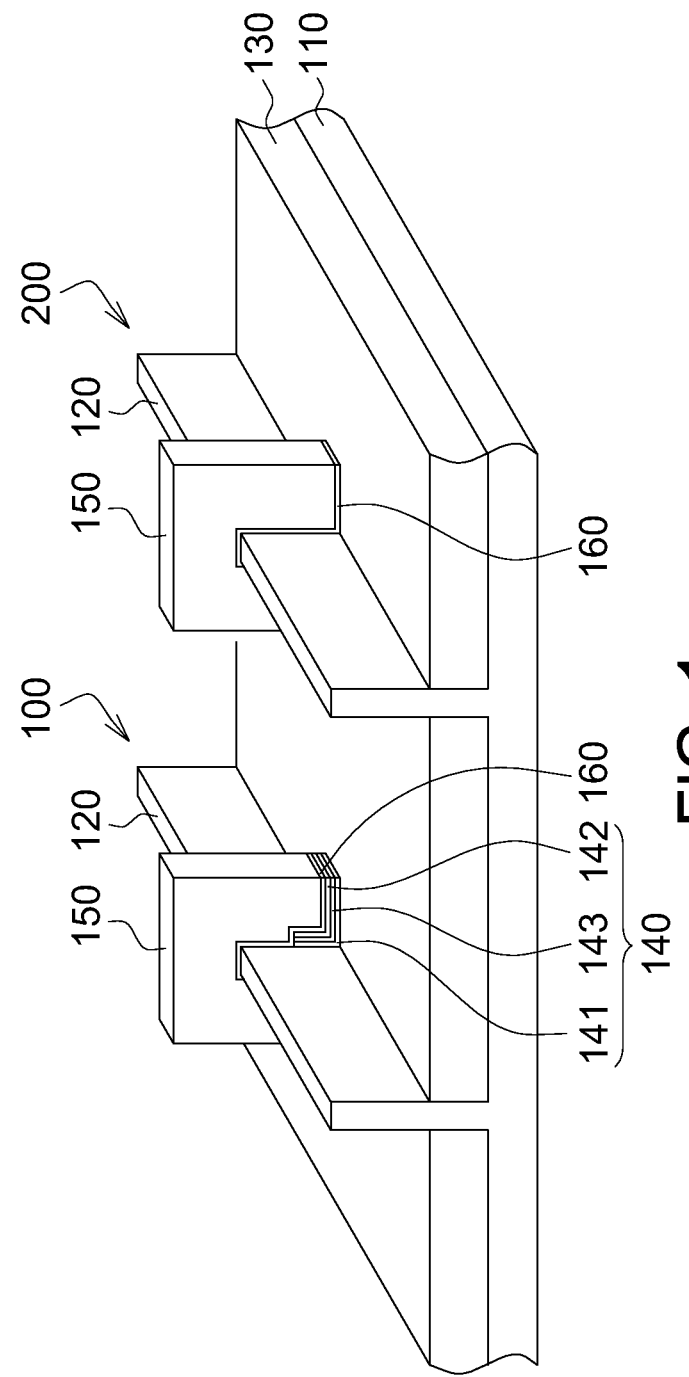
FIG. 1 shows a field effect transistor according to a first embodiment.
Figure 2:
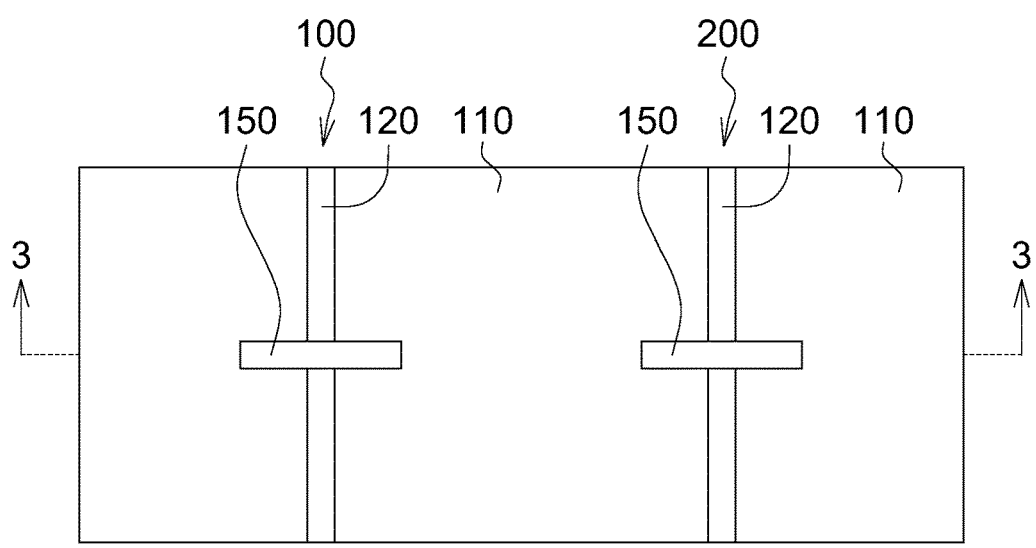
FIG. 2 shows a top view of the field effect transistor of FIG. 1.
Figure 3:
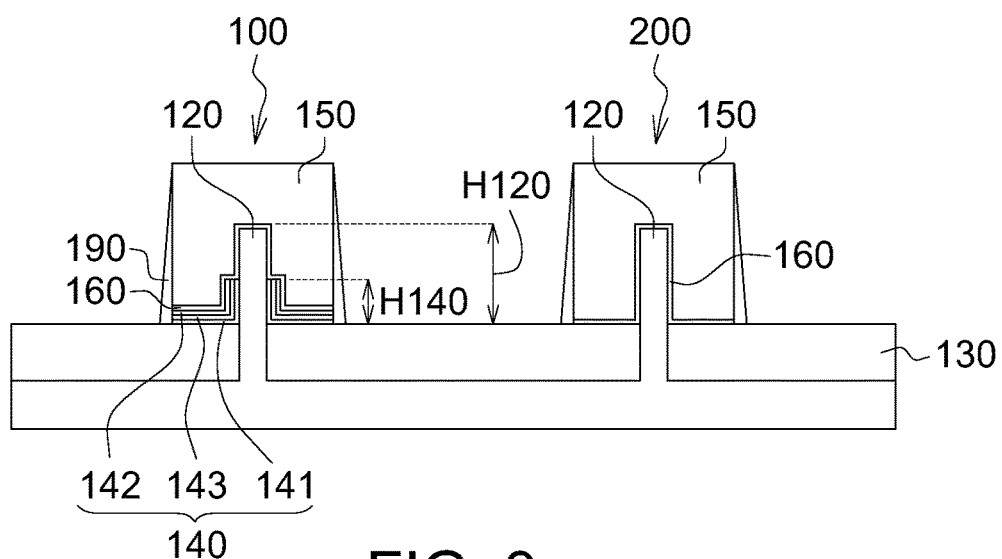
FIG. 3 shows a cross-sectional view of the field effect transistor of FIG. 2 along a cutting line 3-3.

Referring to FIGS. 1 to 3, FIG. 1 shows a field effect transistor (FET) 100, 200 according to a first embodiment, FIG. 2 shows a top view of the FET 100, 200 of FIG. 1, and FIG. 3 shows a cross-sectional view of the FET 100, 200 of FIG. 2 along a cutting line 3-3. The FET 100 comprises a substrate 110, at least a fin bump 120, an insulating layer 130, at least a charge trapping structure 140 and at least a gate structure 150. The material of the substrate 110 can be silicon, silicon germanium (SiGe), silicon carbon (SiC), or group 3 and group 5 chemical element compound, for example. The group 3 and group 5 chemical element compound can be gallium arsenide (GaAs), for example. The fin bump 120 is disposed on the substrate 110. The material of the fin bump 120 can be the same as the material of the substrate 110. The insulating layer 130 is disposed on the substrate 110 and located at two sides of the fin bump 120. The material of the insulating layer 130 can be silicon nitride, silicon oxide or low dielectric constant material, for example.

The charge trapping structure 140 is disposed on the insulating layer 130 and located at at least one side of the fin bump 120. The charge trapping structure 140 is silicon oxide/silicon nitride/silicon oxide or silicon oxide/high K dielectric material/silicon oxide tri-layer structure, for example. The material of each layer of the charge trapping structure 140 can be high dielectric constant material, such as $HfO_2$, $HfSiO_2$ or HfSiON, for example. Referring to FIG. 1, in the left EFT 100, the cross section of the charge trapping structure 140 is L-shaped. That is to say, the charge trapping structure 140 not only contacts the lateral wall of the fin bump 120, but also contacts the surface of the insulating layer 130.

The gate structure 150 covers the fin bump 120 and the charge trapping structure 140. The material of the gate structure 150 can be poly-silicon, for example. The gate structure 150 is stacked on the charge trapping structure 140 and the fin bump 120 to form a 3-dimensional fin DET 100.

Please referring to FIG. 3, the charge trapping structure 140 includes a first oxide layer 141, a second oxide layer 142 and a nitride layer 143. The nitride layer 143 is disposed between the first oxide layer 141 and the second oxide layer 142. The material of the first oxide layer 141 and the second oxide layer 142 can be silicon oxide, and the material of the nitride layer 143 can be silicon nitride, for example. The first oxide layer 141, the nitride layer 142 and the second oxide layer 143 form an ONO stack structure. In one embodiment, the thickness of the L-shaped charge trapping structure 140 is uniform at the lateral wall of the fin bump 120 and the surface of the insulating layer 130.

Regarding the relationship between the charge trapping structure 140 and the fin bump 120, the charge trapping structure 140 is disposed at two sides of the fin bump 120. The charge trapping structure 140 covers part of the lateral wall of the fin bump 120 only, and does not cover whole of the lateral wall of the fin bump 120. The height H120 of the fin bump 120 is larger than the height H140 of the charge trapping structure 120.

Regarding the relationship between the charge trapping structure 140, the gate structure 150 and the insulating layer 130, the gate structure 150 and the insulating layer 130 are separated by the charge trapping structure 140, such that the gate structure 150 and the insulating layer 130 are not contacted with each other.

Please referring to FIG. 3, the FET 100 further comprises a high K dielectric layer 160. The material of the high K dielectric layer 160 can be SiN, SiON or a group of metal oxide. The metal oxide can be rare earth elements, such as hafnium oxide (HfO2), hafnium silicon oxide (HfSiO4), hafnium silicon oxynitride (HfSiON), aluminum oxide (Al2O3), lanthanum oxide (La2O3), lanthanum aluminum oxide (LaAlO), tantalum oxide (Ta2O5), zirconium oxide (ZrO2), zirconium silicon oxide (ZrSiO4), hafnium zirconium oxide (HfZrO), strontium bismuth tantalite (SrBi2Ta2O9, SBT), lead zirconate titanate (PbZrxTi1-xO3, PZT) or barium strontium titanate (BaxSr1-xTiO3, BST), for example. The high K dielectric layer 160 covers the top end of the fin bump 120 and the charge trapping structure 140. The high K dielectric layer 160 is disposed between the gate structure 150 and the charge trapping structure 140.

Please refer to FIGS. 4A to 4L, which show a manufacturing method of the field effect transistor 100 according to the first embodiment. Firstly, an original substrate 110' is provided. The original substrate 110' is indicated via a dotted line for representing an original state of the substrate 110 before etching. Then, a hard mask layer 170 is formed. The material of the hard mask layer 170 can be silicon oxide or silicon nitride, for example. Afterwards, the original substrate 110' is etched by using the hard mask layer 170 as a mask to form a fin bump 120 on the substrate 110.

Figure 4A:
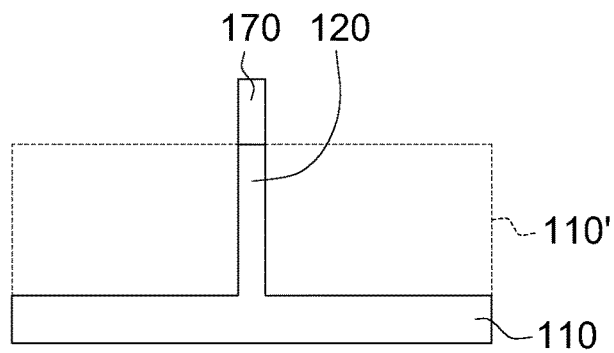
FIGS. 4A to 4L show a manufacturing method of the field effect transistor according to the first embodiment.
Figure 4B:
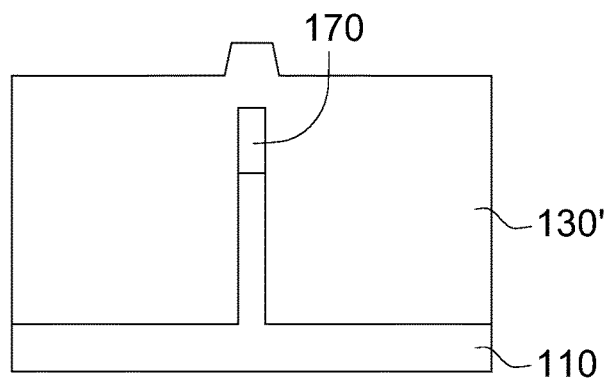

Then, referring to FIG. 4B, an insulating material 130' is formed on the substrate 110. In this step, the insulating material 130' can be formed by chemical vapor deposition (CVD) process, for example.

Figure 4C:
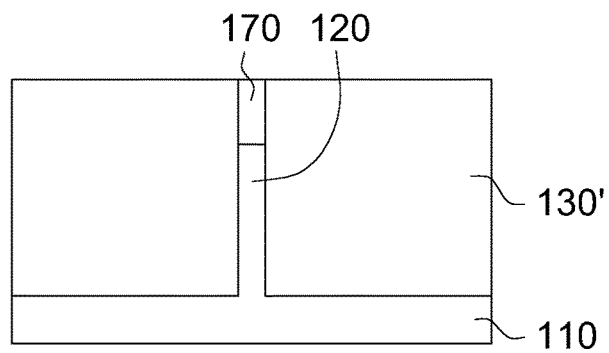

Afterwards, referring to FIG. 4C, the insulating material 130' is polished by chemical-mechanical polishing (CMP) to expose the hard mask layer 170.

Figure 4D:
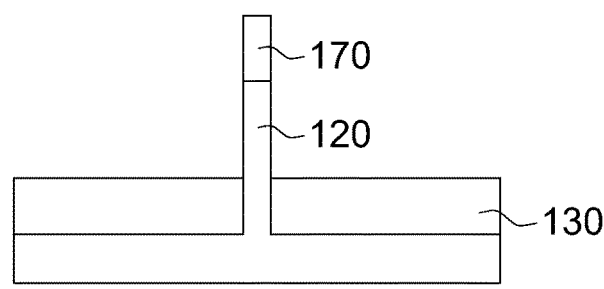

Then, referring to FIG. 4D, the insulating material 130' (shown in FIG. 4C) is etched by using the hard mask layer 170 as a mask. In this step, the insulating material 130' does not etched fully. The remaining insulating material 130' forms the insulating layer 130.

Figure 4E:
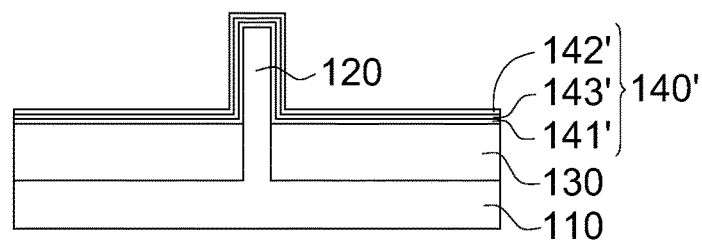

Afterwards, referring to FIG. 4E, a charge trapping material 140' is formed on the fin bump 120 and the insulating layer 130. The charge trapping material 140' includes a first oxide material 141', a nitride material 142' and a second oxide material 142'.

Figure 4F:
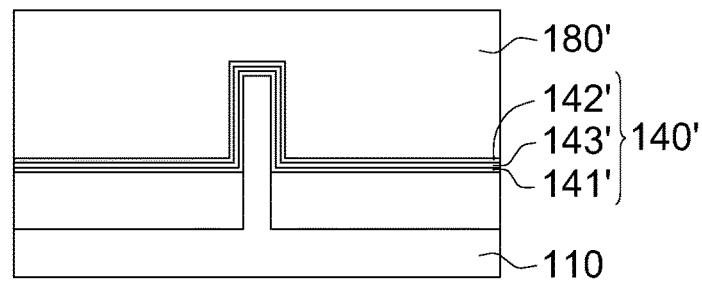

Then, referring to FIG. 4F, a mask material 180' is formed on the charge trapping material 140'.

Figure 4G:
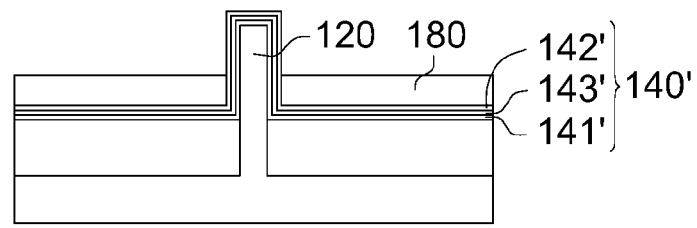

Afterwards, referring to FIG. 4G, the mask material 180' (shown in FIG. 4F) is etched to remain a mask layer 180 having a predetermined thickness.

Figure 4H:
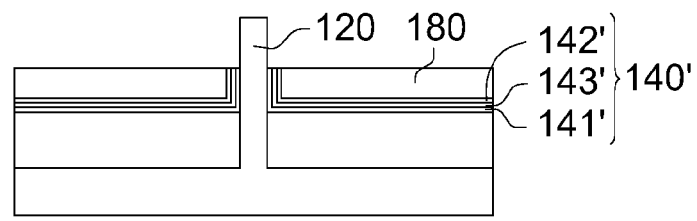

Then, referring to FIG. 4H, the part of the charge trapping material 140' covering the fin bump 120 is etched to expose part of the fin bump 120.

Figure 4I:
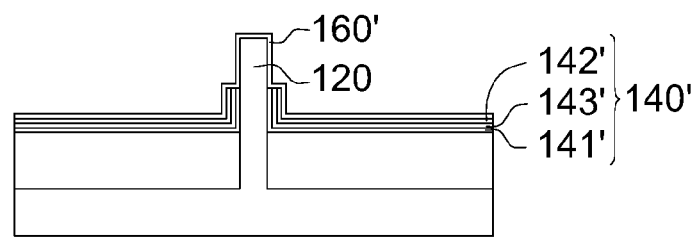

Afterwards, referring to FIG. 4I, the mask layer 180 is removed and a high K dielectric material 160' is formed on the fin bump 120 and the nitride-oxide material 140'.

Figure 4J:
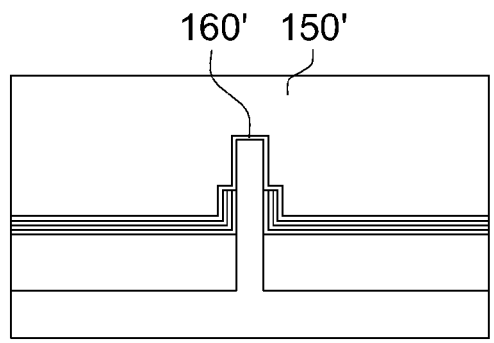

Then, referring to FIG. 4J, a gate material 150' is formed on the high K dielectric material 160'.

Figure 4K:
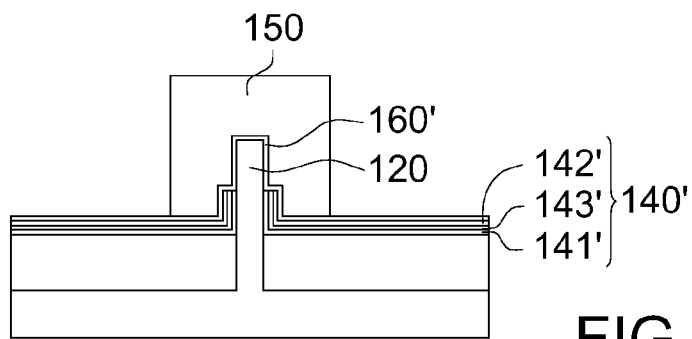

Afterwards, referring to FIG. 4K, the gate material 150' (shown in FIG. 4J) is patterned to form the gate structure 150 covering the fin bump 120, part of the high K dielectric material 160' and part of the charge trapping material 140'.

Figure 4L:
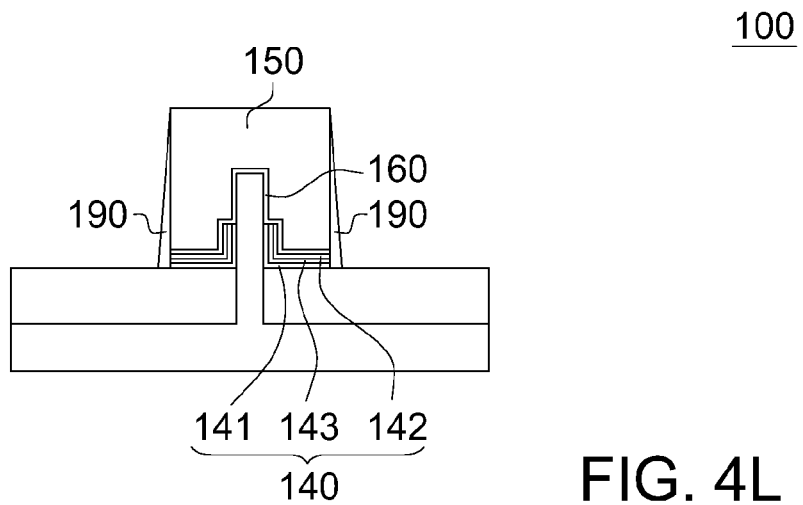

Then, referring to FIG. 4L, the high K dielectric material 160' (shown in FIG. 4H) and the charge trapping material 140' (shown in FIG. 4H) is etched by using the gate structure 150 as a mask.

Afterwards, referring to FIG. 4L, spacers 190 are formed at lateral walls of the gate structure 150.

In the present embodiment, the gate structure 190 is formed on the high K dielectric material 160' (shown in FIG. 4H) by means of patterning, and the high K dielectric material 160' is etched by using the gate structure 150 as a mask to form the high K dielectric layer 160. Therefore, the high K dielectric layer 160 is merely disposed under the gate structure 150 and is not disposed at lateral walls of the gate structure 150.

Second Embodiment

Figure 5:
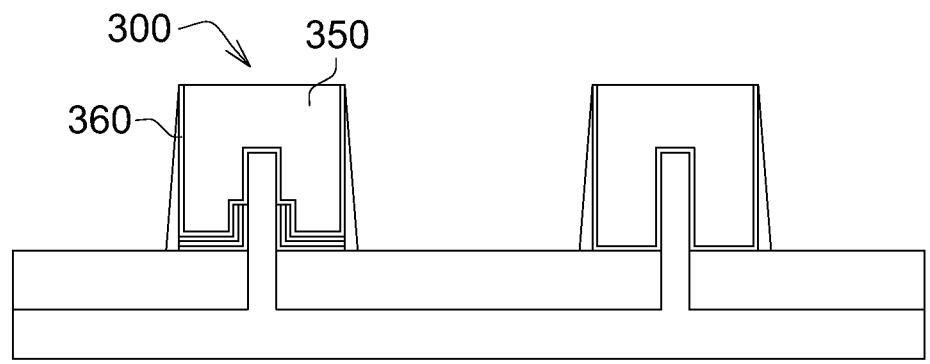
FIG. 5 shows a field effect transistor according to a second embodiment.

Please referring to FIG. 5, FIG. 5 shows a field effect transistor 300 according to a second embodiment. The filed effect transistor 300 and the manufacturing method thereof of the present embodiment differ with the field effect transistor 100 and the manufacturing method thereof of the first embodiment in the position of a high K dielectric layer 360 and the forming steps of a gate structure 350 and the high K dielectric layer 360. Other similarities are not repeated here.

Referring to FIG. 5, the high K dielectric layer 360 not only disposed under the gate structure 350, but also covers the lateral walls of the gate structure 350. The forming steps of the gate structure 350 and high K dielectric layer 360 of the present embodiment is different with that of the first embodiment, such that the location of the high K dielectric layer 360 is different with that of the high K dielectric layer 160 (shown in FIG. 3) of the first embodiment.

Figure 6A:
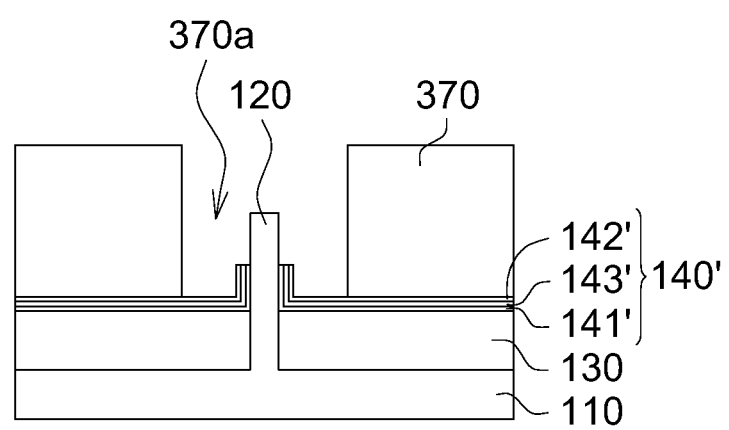
FIGS. 6A to 6B show a manufacturing method of the field effect transistor according the second embodiment.
Figure 6B:
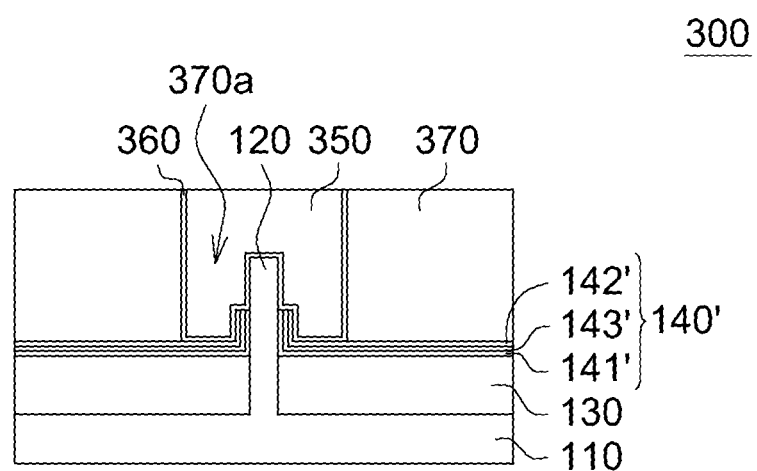

Please refer to FIG. 6A to 6B, which show a manufacturing method of the field effect transistor 300 according the second embodiment. Firstly, referring to FIG. 6A, it is similar to the manufacturing method of the first embodiment that the fin bump 120, the insulating layer 130 and the charge trapping material 140' are formed on the substrate 110. Then, a patterned layer 370 is formed on the charge trapping material 140'. The patterned layer 370 has an opening 370a exposing the fin bump 120 and part of the charge trapping material 140'. The patterned layer 370 can be formed by the following steps. A material layer is formed on the gate structure 150 of FIG. 4L. Then, the material layer is etched to expose the gate structure 150. Afterwards, the gate structure 150 is removed.

Afterwards, referring to FIG. 6B, the high K dielectric layer 360 is formed in the opening 370a. The high K dielectric layer 360 not only covers part of the fin bump 120 and part of the charge trapping material 140', but also covers the lateral wall of the opening 370a.

Then, referring to FIG. 6B, the gate 350 is formed in the opening 370a.

In the present embodiment, the high K dielectric layer 360 and the gate structure 350 are formed in the opening 370a of the patterned layer 370, therefore, the high K dielectric layer 360 can be not only disposed under the gate structure 350, but also disposed at the lateral walls of the gate structure 350.

While the disclosure has been described by way of example and in terms of the exemplary embodiments, it is to be understood that the disclosure is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. A manufacturing method of a field effect transistor, comprising:
    providing a substrate;
    forming a fin bump on the substrate;
    forming an insulating layer on the substrate, the insulating layer being located at two sides of the fin bump;
    disposing a charge trapping material on the fin bump and the substrate;
    etching part of the charge trapping material covering the fin bump to expose part of the fin bump;
    forming a gate structure covering the fin bump and the charge trapping material; and
    etching the charge trapping material by using the gate structure as a mask to form a charge trapping structure, wherein the charge trapping structure is disposed on the insulating layer and located at least one side of the fin bump, a cross-section of the charge trapping structure is L-shaped, the charge trapping structure covers part of the lateral wall of the fin bump, a top of the charge trapping structure is lower than a top of the fin bump and higher than a bottom of the fin bump, and none of the charge trapping structure is on the top of the fin bump.

2. The manufacturing method of the field effect transistor according to claim 1, wherein after the part of the fin bump is exposed, the manufacturing method further comprising:
    forming a high K dielectric material covering the fin bump and the charge trapping material.

3. The manufacturing method of the field effect transistor according to claim 2, wherein in the step of forming the high K dielectric material, the high K dielectric material further covers an external lateral wall of the gate structure.

4. The manufacturing method of the field effect transistor according to claim 1, wherein after the charge trapping structure is formed, the charge trapping structure is located at two sides of the fin bump.

5. The manufacturing method of the field effect transistor according to claim 1, wherein after the charge trapping structure is formed, the gate structure and the insulating layer are separated by the charge trapping structure.

6. The manufacturing method of the field effect transistor according to claim 1, wherein after the charge trapping structure is formed, the thickness of the charge trapping structure is substantially uniform.

7. The manufacturing method of the field effect transistor according to claim 1, wherein the step of disposing the charge trapping material on the fin bump and the substrate includes:
    disposed a first oxide material on the fin bump and the substrate;
    disposing a nitride material on the first oxide material; and
    disposing a second oxide material on the nitride material.

8. The manufacturing method of the field effect transistor according to claim 1, wherein after the charge trapping structure is formed, the charge trapping structure exposes a top of the fin bump.

9. The manufacturing method of the field effect transistor according to claim 1, wherein after the charge trapping structure is formed, a height of the fin bump is larger than a height of the charge trapping structure.

10. The manufacturing method of the field effect transistor according to claim 1, wherein after the charge trapping structure is formed, the charge trapping structure exposes a part of the insulating layer.

* * * * *